United States Patent
Seethamraju et al.

(10) Patent No.: US 8,532,243 B2
(45) Date of Patent: Sep. 10, 2013

(54) DIGITAL HOLD IN A PHASE-LOCKED LOOP

(75) Inventors: Srisai R. Seethamraju, Nashua, NH (US); Jerrell P. Hein, Driftwood, TX (US); Kenneth Kin Wai Wong, Weston, MA (US); Qicheng Yu, Nashua, NH (US)

(73) Assignee: Silicon Laboratories Inc., Austin, TX (US)

(*) Notice: Subject to any disclaimer, the term of this patent is extended or adjusted under 35 U.S.C. 154(b) by 1176 days.

(21) Appl. No.: 11/673,819

(22) Filed: Feb. 12, 2007

(65) Prior Publication Data
US 2008/0191762 A1 Aug. 14, 2008

(51) Int. Cl.
*H03D 3/24* (2006.01)

(52) U.S. Cl.
USPC ......... 375/376; 375/371; 375/372; 375/373; 375/374; 375/375; 327/156; 327/158; 327/159

(58) Field of Classification Search
USPC ......... 375/350, 371–376; 331/1, 2; 327/156, 327/158
See application file for complete search history.

(56) References Cited

U.S. PATENT DOCUMENTS

| | | | |
|---|---|---|---|
| 5,572,167 A | | 11/1996 | Alder et al. |
| 5,606,319 A | * | 2/1997 | Yatim et al. .................... 341/144 |
| 5,648,964 A | * | 7/1997 | Inagaki et al. ................. 370/228 |
| 5,757,652 A | * | 5/1998 | Blazo et al. ...................... 702/69 |
| 5,880,973 A | * | 3/1999 | Gray et al. ...................... 702/190 |
| 6,052,034 A | * | 4/2000 | Wang et al. ........................ 331/2 |
| 7,148,753 B1 | * | 12/2006 | Garlepp et al. .................... 331/2 |
| 7,590,151 B2 | * | 9/2009 | Middleton et al. ............ 370/516 |
| 2005/0160124 A1 | * | 7/2005 | Bisiaux .......................... 708/300 |
| 2006/0171496 A1 | * | 8/2006 | Nakamuta et al. ............. 375/376 |
| 2007/0230642 A1 | * | 10/2007 | Wu et al. ......................... 375/350 |
| 2008/0094147 A1 | * | 4/2008 | Olsson et al. .................. 331/1 A |

OTHER PUBLICATIONS

Donadio, Matthew P., "CIC Filter Introduction," free publication by Iowegian, Jul. 18, 2000, pp. 1-6.
Hogenauer, Eugene B., "An Economical Class of Digital Filters for Decimation and Interpolation," IEEE Transactions on Acoustics, Speech, and Signal Processing, vol. ASSP-29, No. 2, Apr. 1981, pp. 155-162.
"Cascaded Integrator-Comb Filter," from Wikipedia, 2 pages, retrieved Nov. 28, 2006 from URL: http://en.wikipedia.org/wiki/Cascaded_Integrator-Comb_Filter.

* cited by examiner

*Primary Examiner* — Daniel Washburn
*Assistant Examiner* — Eboni Hughes
(74) *Attorney, Agent, or Firm* — Abel Law Group, LLP (57) ABSTRACT

A technique that is readily implemented in monolithic integrated circuits includes a method including generating an output clock signal during a presence of a reference clock signal based, at least in part, on a digital control value indicating a phase difference between a feedback signal of a PLL and a reference clock signal. The method includes generating the output clock signal during an absence of the reference clock signal and based, at least in part, on an average digital control word indicating an average value of a number of samples of the digital control value during the presence of the reference clock signal, the number of samples preceding the absence of the reference clock signal by a delay period. The number of samples is selected from a plurality of numbers of samples and the delay period is selected from a plurality of delay periods.

23 Claims, 5 Drawing Sheets

DIGITAL HOLD IN A PHASE-LOCKED LOOP

BACKGROUND

1. Field of the Invention

This application relates to clock signal generation in high speed systems and more particularly to generation of clock signals when a reference signal used in generating those clock signals is lost.

2. Description of the Related Art

High speed communication systems require high speed clock signals for transmission and reception of information. For example, in optical communication systems, line cards compliant with standards such as Synchronous Optical Network (SONET) or Synchronous Digital Hierarchy (SDH) (the European counterpart to SONET), utilize clock generation circuits to generate high speed clock signals used in data transmission and reception. In a typical clock generation circuit in such SONET (or SDH) compliant systems, a phase-locked loop (PLL) receives a synchronization input reference clock signal and generates one or more high speed clock signals suitable for use in transmitting or receiving data. According to one aspect of such a communication system, when the synchronization input reference clock signal is lost, the system enters a mode known as "holdover" mode and continues to output a clock signal.

The accuracy with which the clock generation circuit provides the clock signal in holdover mode is typically specified in the SONET or SDH standards. For example, GR-1244-CORE specifies Stratum 3 holdover initial frequency error at $\pm 50 \times 10^{-9}$ (50 ppb). The clock generation circuit tries to maintain the output clock signal during holdover mode at a frequency based on a previous reference clock signal. While generating the clock signal in holdover mode, the PLL typically no longer uses feedback to generate the output clock signal. However, the clock signal generated in holdover mode may still drift to such an extent as to fail to meet the holdover requirements. For example, certain PLLs may fail to meet holdover requirements because the voltage controlled oscillators utilized in such systems have too much frequency variation over temperature (e.g., 100 ppm/° C.). In addition, certain phase-locked loops, for example, phase-locked loops using digital techniques as described in application Ser. No. 09/902,541, filed Jul. 10, 2001, entitled "Digitally-Synthesized Loop Filter Circuit Particularly Useful for a Phase-Locked Loop", fail to meet the initial accuracy required when first entering holdover mode due to truncation error.

Thus techniques that improve an integrated circuit implementation of clock signals generated in a holdover mode that achieves specifications for a high accuracy of the frequency of the output clock signal and low jitter are desired.

SUMMARY

A technique that is readily implemented in monolithic integrated circuits includes a phase-locked loop (PLL) that generates an output clock signal based on an average value of a digital control word, indicating a frequency of a controllable oscillator of the PLL. In at least one embodiment of the invention, a method includes generating an output clock signal during a presence of a reference clock signal based, at least in part, on a digital control value indicating a phase difference between a feedback signal of a PLL and a reference clock signal. The method includes generating the output clock signal during an absence of the reference clock signal and based, at least in part, on an average digital control word indicating an average value of a number of samples of the digital control value during the presence of the reference clock signal, the number of samples preceding the absence of the reference clock signal by a delay period. The number of samples is selected from a plurality of numbers of samples and the delay period is selected from a plurality of delay periods.

In at least one embodiment of the invention, an apparatus includes a phase-locked loop (PLL) including a controllable oscillator circuit configured to generate an output signal based, at least in part, on a digital control word during the presence of a reference clock signal and configured to generate the output signal during an absence of the reference clock signal and based, at least in part, on an average digital control word. The PLL includes a digital hold circuit configured to average a first number of samples of the digital control word during a presence of the reference clock signal and preceding an indication of an absence of the reference clock signal by a second number of samples of the digital control word, and generate the average digital control word. The first number of samples is selected from a plurality of numbers of samples and the second number of samples is selected from a plurality of delay periods.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
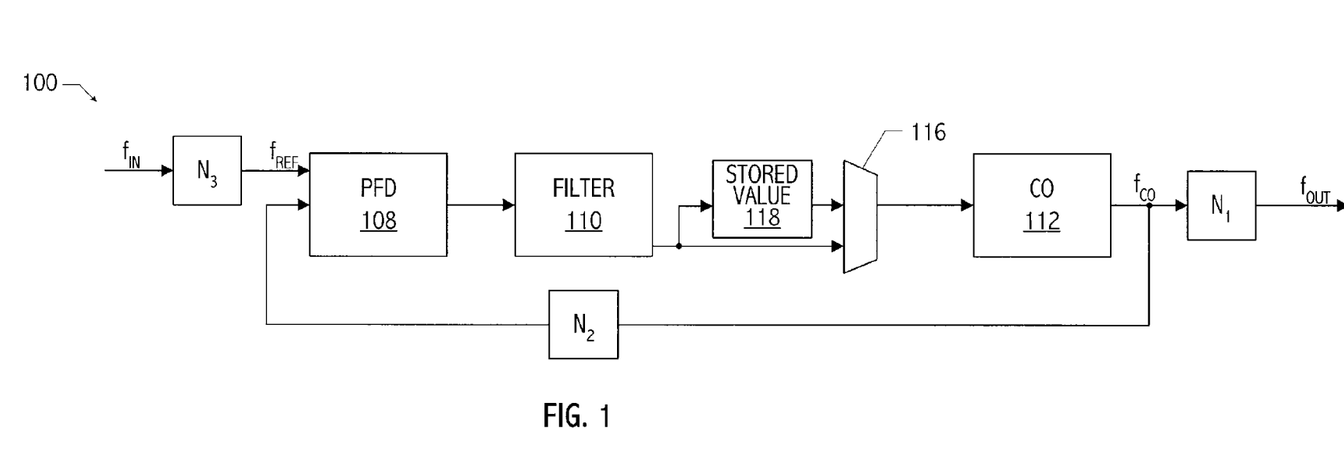
FIG. 1 illustrates a block diagram of an exemplary phase-locked loop (PLL) that supports a holdover mode.

Referring to FIG. 1, an exemplary phase-locked loop (i.e., PLL 100) architecture has a programmable bandwidth (i.e., $f_{3\ dB}$) and a programmable reference frequency (i.e., $f_{REF}$). Such features of a PLL architecture are described in provisional application No. 60/827,530, filed Sep. 29, 2006, entitled "Hitless Switching Architecture," naming Srisai R. Seethamraju, Ronald B. Hulfachor, and Shailesh Chitnis as inventors, which application is incorporated herein by reference. Note that features of PLL 100 are exemplary only and the invention disclosed herein may be implemented in other PLL architectures.

When a holdover condition occurs in PLL 100, that is, when reference clock signal $f_{REF}$ fails, which may be indicated by a loss of signal condition indicator, loop filter 110 of PLL 100 is "frozen" such that a digital control value used to drive controllable oscillator 112 no longer tracks changes to the reference signal, and the frozen output of the loop filter (e.g., stored value 118) is provided to controllable oscillator 112 by select circuit 116 to hold the output frequency of controllable oscillator 112 steady. That is, loop filter 110 output is held to a value corresponding to a clock signal received prior to entering the holdover mode so no updating of loop filter output takes place.

Figure 2:
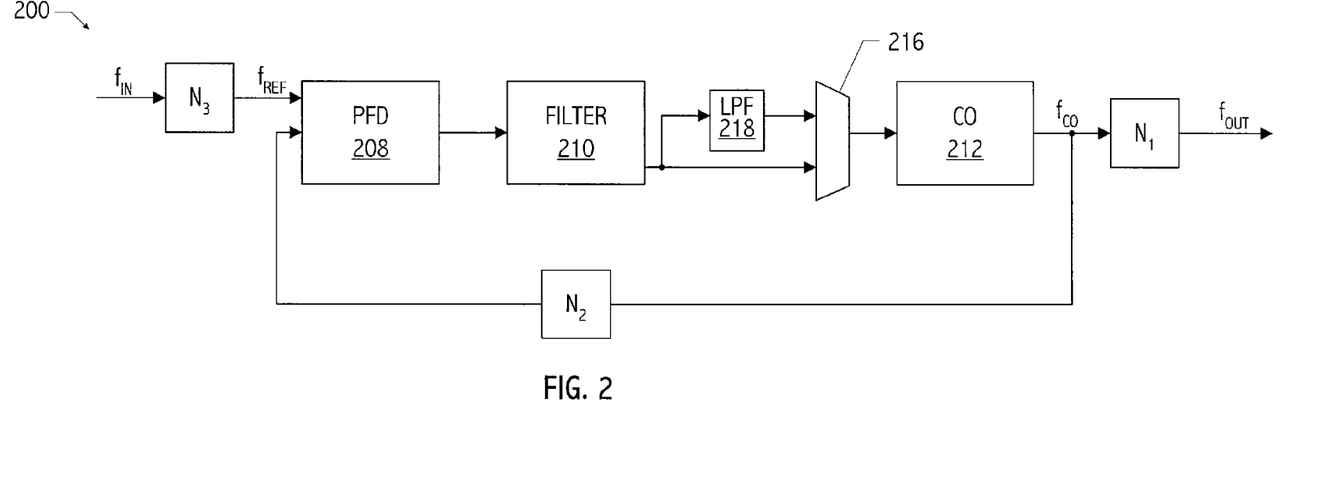
FIG. 2 illustrates a block diagram of an exemplary PLL that supports a holdover mode.

Referring now to FIG. 2, the accuracy of the holdover mode implemented in PLL 100 may be improved by modifying the PLL 100 as illustrated by PLL 200. Phase-locked loop 200 includes phase or phase-frequency detector 208, loop filter 210 and controllable oscillator 212, which in at least one embodiment is a voltage-controlled, temperature compensated oscillator. When the system goes into holdover mode, i.e., when the reference clock signal is lost, controllable oscillator 212 is driven by the "frozen" output of the loop filter 210. In the embodiment illustrated in FIG. 2, the output of the loop filter is filtered using low pass filter 218. Select circuit 216 selects whether to supply the filtered output of the loop filter supplied from low pass filter 218 or the output of loop filter 210 according to whether the system is in holdover mode or normal operational mode. The filtered output supplied from low pass filter 218 during holdover mode contains less quantization noise than the "frozen" loop filter output, so the initial accuracy of the output clock signal in holdover mode will be improved by utilizing the low pass filtered output.

Figure 3:
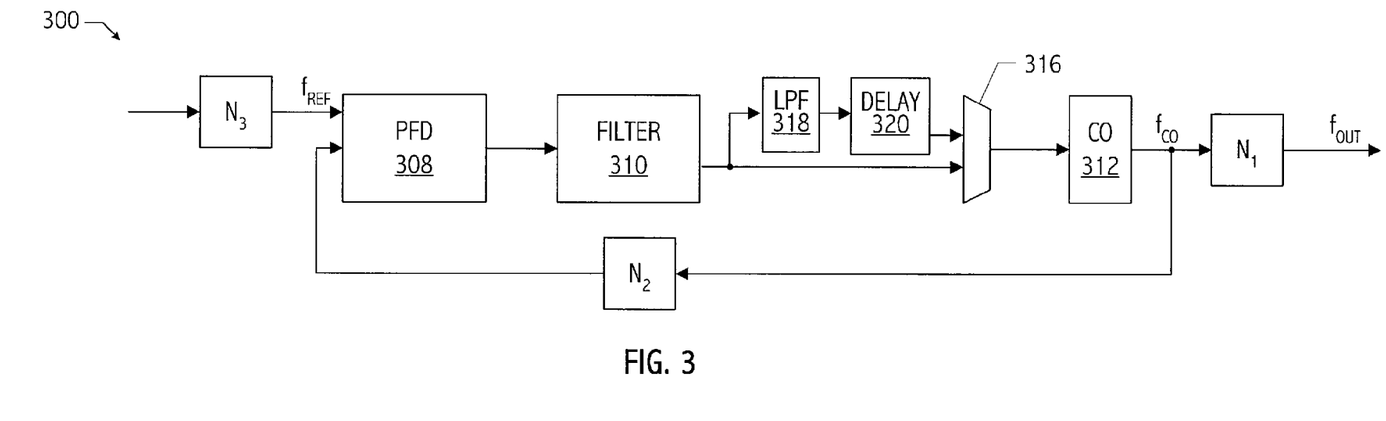
FIG. 3 illustrates a block diagram of an exemplary PLL that supports a holdover mode.
Figure 4:
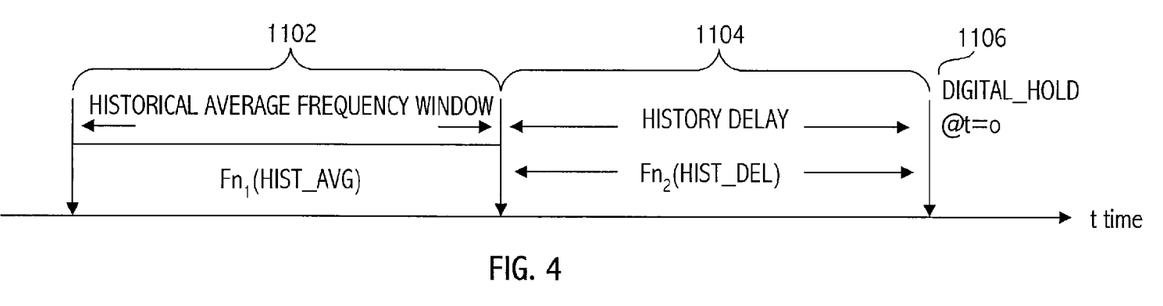
FIG. 4 illustrates an exemplary timeline of PLL operation consistent with at least one embodiment of the present invention.

Referring to FIGS. 3 and 4, in another embodiment a PLL utilizes a delayed (older) and low pass filtered "frozen" value to drive controllable oscillator 312. Thus, the output from loop filter 310 is supplied to low pass filter 318, which supplies delay element 320. Using a version of the loop filter output delayed by a period of time (e.g., period 1104) addresses situations where the reference clock slowly fails, pulling the PLL in the wrong direction for a while before the holdover condition is detected. Note that the order of the delay element and the filter may be reversed in certain implementations. At the time the system enters holdover mode (e.g., time 1106), the output of the delay element is frozen and selected by the PLL.

One technique for implementing PLL 300 includes sampling the output of loop filter 310 at given time intervals over a period of time. The sampled values are stored in storage elements (e.g., memory, registers, or other suitable storage elements). A controller then uses those stored data to generate an average value (e.g., a sliding historical frequency filtering window), or a value determined by other suitable algorithm. In at least one embodiment of PLL 300, the output of loop filter 310, i.e., the digital control word input to controllable oscillator 312, has enough resolution to achieve a PLL jitter specification on the order of a few parts-per-billion (ppb). Thus the digital control word may be a large digital word, M-bits wide (e.g., greater than 30 bits wide). Accordingly, the low-pass filtered and delayed digital control word applied to controllable oscillator 312 in holdover mode may be a large digital word, M-bits wide.

The period of time over which those M-bit wide words are sampled (e.g., period 1102) may be substantial. For example, to meet a specification of less than 50 ppb frequency offset, the period of time may be approximately 30 milliseconds (ms) or greater. For a reference clock signal having a frequency in the Giga-Hertz (GHz) range (e.g., approximately 5.12 GHz) or greater, a sliding historical window applied to the digital control word input of controllable oscillator 312 requires storing a large number of digital control words, e.g., at least R digital control words, M-bits wide, to generate the historical digital control word value for a single stage filter, where $R = 2^{HIST\_AVG}$.

In another implementation, rather than using a sliding historical window, an accumulator is used to calculate an average value of a given number of historical digital control word values. Upon completing the average value calculation, the accumulator is reset and a new calculation begins. Although this implementation uses fewer storage elements, it imposes limitations on the values of HIST_AVG and HIST_DEL, e.g., HIST_AVG<HIST_DEL. In addition, the complexity increases substantially in noisy environments that require multiple stages of filtering (i.e., N>1).

Figure 5:
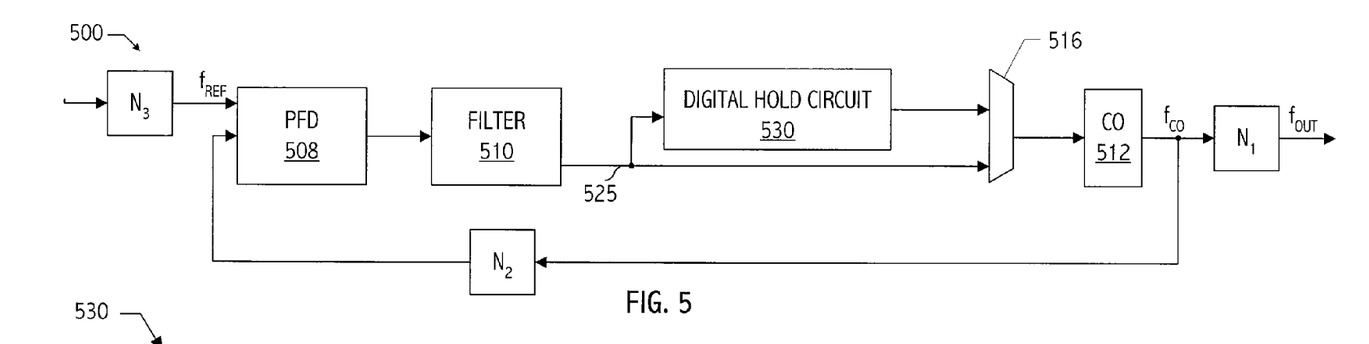
FIG. 5 illustrates an exemplary PLL that supports a holdover mode consistent with at least one embodiment of the present invention.
Figure 6:
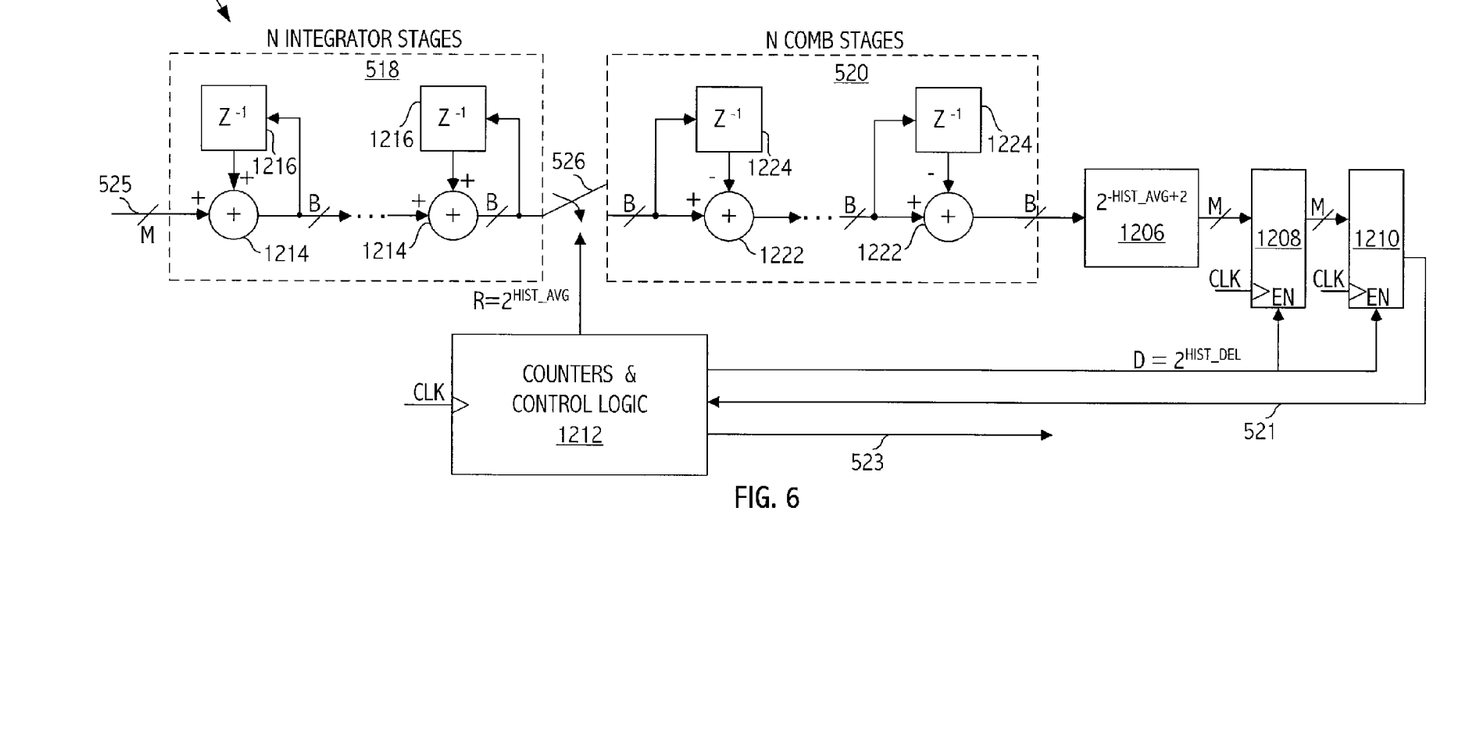
FIG. 6 illustrates a block diagram of a portion of the PLL of FIG. 5 consistent with at least one embodiment of the present invention.

Referring to FIGS. 4-6, in at least one embodiment of a PLL (e.g., PLL 500), the number of storage elements required by an integrated circuit implementation of the holdover function may be substantially decreased by implementing the holdover mode using digital hold circuit 530, which includes a cascaded integrator-comb filter (i.e., a CIC filter, also known as a Hogenauer filter). Select circuit 516 selects whether to supply the output of digital hold circuit 530 or the output of loop filter 510 to controllable oscillator 512 according to whether the system is in holdover mode or normal operational mode. Digital hold circuit 530 includes a CIC decimation filter (e.g., the filter formed by integrator block 518, comb block 520 and switch 526) followed by delay block 522, which implement the historical average frequency period 1102 of FIG. 4 and the historical delay period of FIG. 4, prior to entering digital holdover mode at time 1106.

Referring to FIG. 6, an exemplary digital hold circuit 530 consistent with the present invention, includes N integrator stages and N comb stages with a differential delay of S samples per stage, where N is a number of filter stages used. The differential delay, S, is one of several filter design parameters used to control the filter frequency response. The N comb stages operate at a lower sampling rate than the N integrator stages, i.e., $f_S/R$, where R is an integer rate change factor. The number of stages may be based on noise characteristics of the system, amount of resources available, or other suitable parameters. Switch 526 is used to implement the rate change between integrator block 518 and comb block 520. Switch 526 subsamples the output of integrator block 518, reducing the sample rate from $f_S$ to $f_S/R$. In general, each stage uses R×S storage registers. However, the number of storage registers may be simplified (e.g., by implementing a rate change with a switch, as shown in FIGS. 5 and 6) to S storage registers and one accumulator per stage.

In at least one embodiment of PLL 500, one stage of filtering is used, i.e., N=1, and the differential delay, S=1. Accordingly, integrator block 518 includes a single integrator stage (e.g., a one-pole filter with a unity feedback coefficient) implemented by a single delay stage 1216 (e.g., a single M+2-bit register) and a single accumulator 1214 (e.g., summing node). Comb block 520 includes a single, one-zero filter with a unity feedback coefficient implemented by a single delay stage 1224 (e.g., a single M+2-bit register) and a single accumulator 1222 (e.g., summing node). However, in other implementations, e.g., where S>1 and/or N>1, additional registers may be used.

In at least one embodiment of PLL 500, scaling block 1206 scales the output of the CIC filter (e.g., by $2^{-(HIST\_AVG+2)}$, where N=4). The resulting historical average of the digital control word is sampled and an historical delay, D (e.g., D=$2^{HIST\_DEL}$, where N=4) is implemented by registers 1208 and 1210, each M bits wide. In addition, PLL 500 includes control logic block 1212, which may include a first counter, HIST_AVG bits wide, for implementing the decimation rate, R, of the CIC filter. Control logic block 1212 may also include a second counter, HIST_DEL bits wide for controlling registers 1208 and 1210 to implement the historical delay. Control logic block may also provide other suitable control signals, not shown. The output of register 1210 is a delayed historical average of the digital control word output of loop filter 510, i.e., delayed average value 521.

Figure 7:
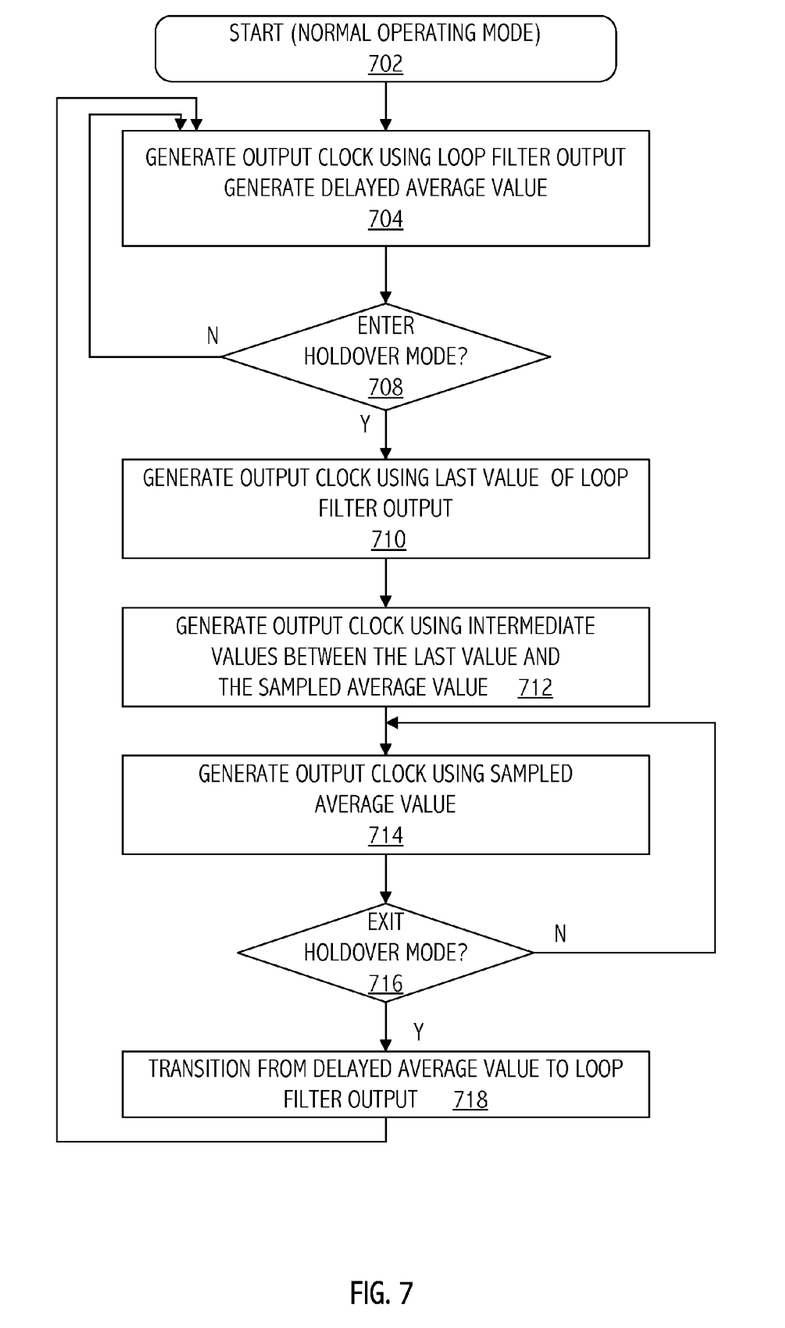
FIG. 7 illustrates exemplary information and control flows consistent with at least one embodiment of the present invention.

Referring to FIG. 5-7, while operating in normal operating mode, holdover mode is disabled and PLL 500 generates an output clock signal based on a reference clock signal (702). Select circuit 516 is configured to provide digital control value 525 (e.g., the output of loop filter 510) to controllable oscillator 512. Meanwhile, digital hold circuit 530 generates delayed average value 521, as described above. When PLL 500 enters holdover mode (708), registers 1208 and 1210 are frozen (along with the integrator and comb stages) and provide delayed average value 521 to control logic 1212. Digital hold circuit 530 provides digital hold value 523 to select circuit 516. Delayed average value 521 is an average value of the digital control word output of loop filter 510, sampled by D samples prior to entering holdover mode. In at least one embodiment, digital hold circuit 530 first provides as digital hold value 523, the output of loop filter 510 just prior to entering holdover mode (710). After one or more samples, digital hold circuit 530 gradually transitions digital hold value 523 from the output of loop filter 510 just prior to entering holdover mode to delayed average value 521 (712). Then, digital hold circuit 530 provides delayed average value 521 as digital hold value 523. Select circuit 516 is configured to provide digital hold value 523 to controllable oscillator 512. Upon exiting holdover mode (716), digital hold circuit may provide transitional values to select circuit 516 (718). Those transitional values gradually approach the digital control word output of loop filter 510 from the delayed average value. Then, select circuit 516 is configured in normal operating mode, providing to controllable oscillator 512, the digital control word output of loop filter 510 (720).

Figure 8:
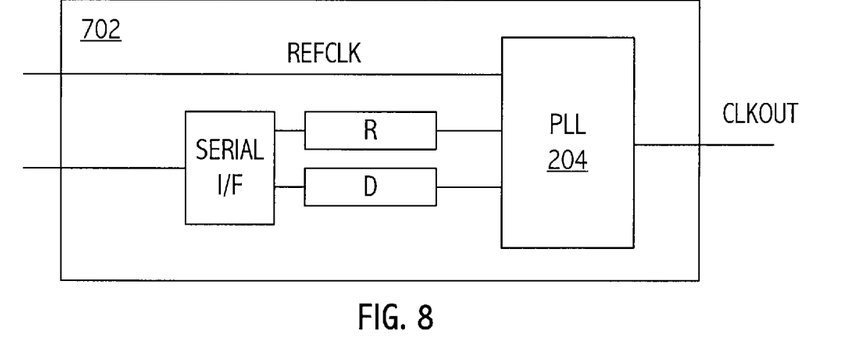
FIG. 8 illustrates a block diagram of an exemplary integrated circuit including a PLL consistent with at least one embodiment of the present invention.
Figure 9:
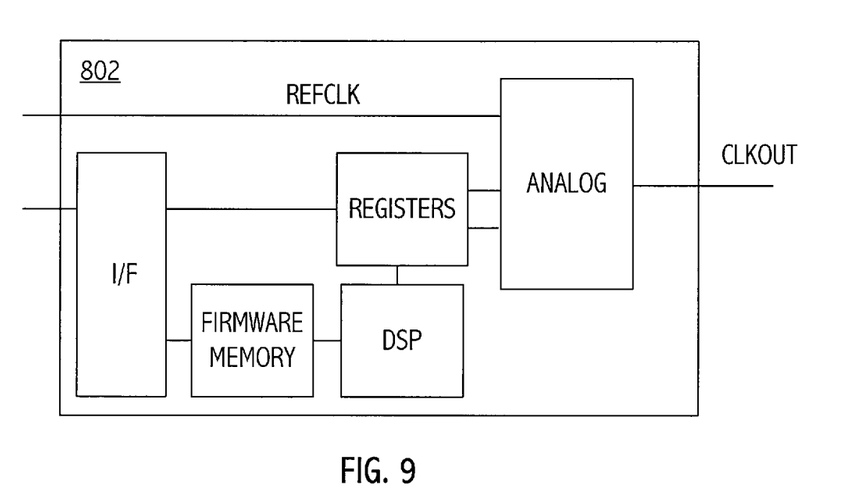
FIG. 9 illustrates a block diagram of an exemplary integrated circuit including a PLL consistent with at least one embodiment of the present invention.

In at least one embodiment of PLL 500, the number of samples averaged and the number of delay samples, i.e., values corresponding to R and D (e.g., HIST_DEL and HIST_AVG), are selectable. The values of R and D may be selected based on the particular application or based on operating conditions. For example, the values of R and D may be selected based on noise on an input clock signal (e.g., a jitter specification), noise introduced by circuits within the PLL, redundancy requirements (e.g., failure modes), an output jitter specification, or other relevant parameters. Referring to FIG. 8, in at least one embodiment of PLL 500, one or more pins on an integrated circuit (e.g., integrated circuit 702) including PLL 500 may be used to select R and D according to their logical value, i.e., R and D are pin programmable. In other embodiments a digital communications interface such as I²C™ or serial peripheral interface (SPI) may be used to select R and D by writing appropriate control information to control registers in a control circuit. Referring to FIG. 9, in at least one embodiment, at least a portion of digital hold circuit 530 is implemented using a digital signal processor, microprocessor, or other general purpose circuit on integrated circuit 802. Values corresponding to R and D may be selected by firmware or a firmware patch residing in or loaded into memory internal or external to the integrated circuit on which PLL 500 resides.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method comprising:
   generating an output clock signal during a presence of a reference clock signal based, at least in part, on a digital control value indicating a phase difference between a feedback signal of a PLL of an integrated circuit and a reference clock signal; and
   generating the output clock signal during an absence of the reference clock signal and based, at least in part, on an average digital control word indicating an average value of a plurality of samples of the digital control value during the presence of the reference clock signal, the plurality of samples preceding the absence of the reference clock signal by a delay period,
   wherein a number of samples in the plurality of samples is selected by the integrated circuit from a plurality of numbers of samples and the delay period is selected by the integrated circuit from a plurality of delay periods.

2. The method, as recited in claim 1, further comprising:
   generating the average value during the presence of the reference clock signal, wherein generating the average value comprises:
      integrating the plurality of samples to generate an intermediate signal; and
      comb filtering the intermediate signal, at a rate based at least in part on the number of samples, to generate a version of the average digital control word used to generate the average digital control word,
   wherein the comb filtering rate is a fraction of the integration rate.

3. The method, as recited in claim 2, wherein the version of the average digital control word has B bits and wherein generating the output clock signal further comprises:
   scaling the version of the average digital control word to generate the average digital control word having M bits.

4. The method, as recited in claim 1, wherein generating the output clock signal further comprises:
   updating the average digital control word based at least in part on the delay period.

5. The method, as recited in claim 1, further comprising:
   in the absence of the reference clock signal, gradually transitioning a frequency of the output signal from a frequency of the output signal prior to the absence of the reference clock signal to a frequency based at least in part on the average digital control word.

6. The method, as recited in claim 1, further comprising:
gradually transitioning the frequency of the output clock signal from a frequency based, at least in part, on the average digital control word to a target frequency based at least in part on a frequency of the reference clock signal and in response to restoration of the reference clock signal from the absence of the reference clock signal.

7. The method, as recited in claim 1, further comprising:
selecting the number of samples and the delay period by the integrated circuit based at least in part on a jitter specification for the output clock signal.

8. The method, as recited in claim 1, further comprising:
selecting a number of integrator and comb stages by the integrated circuit based at least in part on jitter specifications for the output clock signal.

9. An apparatus comprising:
a phase-locked loop (PLL) comprising:
a controllable oscillator circuit configured to generate an output signal based, at least in part, on a digital control word during a presence of a reference clock signal and configured to generate the output signal during an absence of the reference clock signal and based, at least in part, on an average digital control word; and
a digital hold circuit configured to average a plurality of samples of the digital control word during a presence of the reference clock signal and preceding an indication of an absence of the reference clock signal by a delay period, and generate the average digital control word,
wherein a number of samples in the plurality of samples is selected by the digital hold circuit from a plurality of numbers of samples and the delay period is selected by the digital hold circuit from a plurality of delay periods.

10. The apparatus, as recited in claim 9, wherein the digital hold circuit comprises:
at least one integrator stage configured to sample the digital control word at a first rate; and
at least one comb stage coupled to the at least one integrator stage, the at least one comb stage configured to sample an output of the at least one integrator stage at a second rate.

11. The apparatus, as recited in claim 10, wherein the at least one integrator stage includes a plurality of cascaded integrator stages and the at least one comb stage includes a plurality of cascaded comb stages, the number of cascaded integrator stages being equal to the number of cascaded comb stages.

12. The apparatus, as recited in claim 11, wherein the number is based at least in part on a noise specification.

13. The apparatus, as recited in claim 10, wherein the second rate is a fraction of the first rate, the fraction being based at least in part on a number of samples used to obtain an historical average value.

14. The apparatus, as recited in claim 9, wherein the digital control word and the average digital control word are M-bits wide and the digital hold circuit comprises a cascaded integrator-comb (CIC) filter circuit configured to generate a B-bit average digital control word, B being greater than M and based at least in part on M and a ratio between the first rate and the second rate.

15. The apparatus, as recited in claim 14, wherein the digital hold circuit further comprises:
a scaling circuit configured to scale the B-bit average digital control word generated by the CIC filter down to the average digital control word having M bits; and
a number of M-bit storage elements configured to store consecutive versions of the M-bit average digital control word, the consecutive versions corresponding to versions of the M-bit average digital control word sampled based, at least in part, on the delay period; and
a control circuit configured to control the CIC filter based at least in part on the first number of samples and configured to control the M-bit storage elements based at least in part on the delay period.

16. An apparatus comprising:
means for generating an output clock signal during a presence of a reference clock signal and based, at least in part, on a digital control value indicating a phase difference between a feedback signal of a PLL and a reference clock signal and generating the output clock signal during an absence of the reference clock signal based at least in part on an average digital control word; and
means for generating the average digital control word indicating an average value of a plurality of samples of the digital control value during the presence of the reference clock signal, the plurality of samples preceding the absence of the reference clock signal by a delay period,
wherein a number of samples in the plurality of samples is selected by the means for generating the average digital control word from a plurality of numbers of samples and the delay period is selected by the means for generating the average digital control word from a plurality of delay periods.

17. The apparatus, as recited in claim 16, wherein the means for generating the average digital control word comprises a cascaded integrator-comb (CIC) filter.

18. The apparatus, as recited in claim 16 wherein the means for generating the average digital control word comprises:
means for selecting the number of samples of the digital control value from a plurality of numbers of samples; and
means for selecting the delay period from a plurality of delay periods.

19. The apparatus, as recited in claim 17, wherein the means for generating the average digital control word further comprises a means for controlling the CIC filter and the storage elements based at least in part on the number of samples and the delay period.

20. The apparatus, as recited in claim 16, wherein the means for generating the average digital control word comprises a means for storing and updating the average digital control word based at least in part on the delay period.

21. A method comprising:
generating an output clock signal during a presence of a reference clock signal based, at least in part, on a digital control value indicating a phase difference between a feedback signal of a PLL and a reference clock signal; and
generating the output clock signal during an absence of the reference clock signal and based, at least in part, on an average digital control word indicating an average value of a plurality of samples of the digital control value during the presence of the reference clock signal, the plurality of samples preceding the absence of the reference clock signal by a delay period, wherein a number of samples in the plurality of samples is selected from a plurality of numbers of samples and the delay period is selected from a plurality of delay periods, wherein generating the output clock signal during an absence of the reference clock signal comprises:

providing a last value of a loop filter output as the digital hold value during a first interval;

providing intermediate values between the last value and the average digital control word as the digital hold value during a second interval; and providing the average digital control word as the digital hold value during a third interval.

22. The apparatus, as recited in claim 9, wherein the digital hold circuit comprises:

a control module configured to provide a last value of a loop filter output as the digital hold value during a first interval of the absence of the reference clock signal, configured to provide intermediate values between the last value and the average digital control word as the digital hold value during a second interval of the absence of the reference clock signal, and configured to provide the average digital control word as the digital hold value during a third interval of the absence of the reference clock signal.

23. The apparatus, as recited in claim 16, wherein the means for generating the average digital control word provides a last value of a loop filter output as the digital hold value during a first interval of the absence of the reference clock signal, provides intermediate values between the last value and the average digital control word as the digital hold value during a second interval of the absence of the reference clock signal, and provides the average digital control word as the digital hold value during a third interval of the absence of the reference clock signal.

* * * * *

UNITED STATES PATENT AND TRADEMARK OFFICE
CERTIFICATE OF CORRECTION

Page 1 of 1

PATENT NO. : 8,532,243 B2
APPLICATION NO. : 11/673819
DATED : September 10, 2013
INVENTOR(S) : Jones It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1301 days.

Signed and Sealed this
Sixteenth Day of February, 2016

Michelle K. Lee
*Director of the United States Patent and Trademark Office*

UNITED STATES PATENT AND TRADEMARK OFFICE
CERTIFICATE OF CORRECTION

PATENT NO. : 8,532,243 B2  
APPLICATION NO. : 11/673819  
DATED : September 10, 2013  
INVENTOR(S) : Srisai Rao Seethamraju et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1301 days.

This certificate supersedes the Certificate of Correction issued February 16, 2016.

Signed and Sealed this
Twenty-second Day of March, 2016

Michelle K. Lee
*Director of the United States Patent and Trademark Office*